United States Patent [19]

Nelson

[11] Patent Number: 4,760,285
[45] Date of Patent: Jul. 26, 1988

[54] HALL EFFECT DEVICE WITH EPITAXAL LAYER RESISTIVE MEANS FOR PROVIDING TEMPERATURE INDEPENDENT SENSITIVITY

[75] Inventor: Richard W. Nelson, Freeport, Ill.

[73] Assignee: Honeywell Inc., Minneapolis, Minn.

[21] Appl. No.: 32,114

[22] Filed: Mar. 30, 1987

[51] Int. Cl.$^4$ .................. H03K 17/90; G01R 33/06
[52] U.S. Cl. .................. 307/309; 324/251; 357/27; 307/311; 307/296 R
[58] Field of Search .......... 307/309; 324/251, 117 H; 357/27, 28; 323/368, 294

[56] References Cited

U.S. PATENT DOCUMENTS 4,028,718 6/1977 Migitaka et al. .................. 357/27
4,371,837 2/1983 Sieverin ........................... 307/309
4,593,241 6/1986 Eulenberg et al. .................. 307/309
4,634,961 1/1987 Popovic et al. .................... 357/28

Primary Examiner—Stanley D. Miller
Assistant Examiner—B. P. Davis
Attorney, Agent, or Firm—Charles L. Rubow

[57] ABSTRACT

A linear Hall effect integrated circuit in which the output signal of a Hall element formed in an epitaxial layer is amplified by an amplifier circuit whose gain is determined by a resistor partially formed in the same epitaxial layer. A first amplifier stage configured as a voltage to current converter is connected through a current mirror to a second amplifier stage configured as a current to voltage converter. The current bias for the first amplifier stage is controlled by a resistor also partially formed in the epitaxial layer.

16 Claims, 2 Drawing Sheets

HALL EFFECT DEVICE WITH EPITAXAL LAYER RESISTIVE MEANS FOR PROVIDING TEMPERATURE INDEPENDENT SENSITIVITY

The invention disclosed herein relates generally to Hall effect and similar sensors characterized by sensitivities which vary significantly with temperature, and more particularly to integrated circuit Hall effect devices with means for achieving substantially temperature independent sensitivity.

Hall effect sensors are recognized as offering substantial advantages in many sensing applications. For some time, such sensors have been widely used where an on-off or binary output is required or acceptable. Hall effect sensors have also been used in various applications requiring analog outputs. However, such uses have been limited because the output voltage of a Hall element is so low that amplification is required, and, since the Hall element sensitivity varies with temperature, the amplification must also be made to vary with temperature in a compensating manner.

It has been common to utilize expensive and bulky precision amplifiers and compensation circuitry in attempts to achieve acceptable accuracy, including linearity and stability over a temperature range. However, even these measures have not resulted in sufficient accuracy for many applications. Further, many applications for which the accuracy requirements could be met with known amplification and compensation circuitry cannot support the high cost of such circuitry.

The applicant has devised a unique integrated circuit Hall effect device in which the Hall effect element and portions of amplifier gain control and responsivity tracking resistors are formed in the same epitaxial layer, thereby providing precise temperature compensation with very compact and inexpensive circuitry which further features various convenient offset and null adjustments to facilitate setting the device for precision temperature independent operation.

SUMMARY OF THE INVENTION

The invention is an integrated circuit Hall effect or similar sensing device with means for providing temperature independent sensitivity. The device comprises a Hall effect element formed in an epitaxial layer and amplifier means including resistor means of which a portion is formed in the same epitaxial layer. The amplifier means may comprise a first amplifier stage formed of a pair of ideally identical amplifiers connected in a voltage to current conversion (transconductance) arrangement, a second amplifier stage configured for current to voltage conversion (transresistance) and a current mirror interface connecting the first and second amplifier stages. The first amplifier stage may include a bias resistor of which a portion is formed in the epitaxial layer. The second amplifier stage includes adjustment means having a resistor of which a portion is also formed in the epitaxial layer for adjusting the rate of change of transresistance with respect to temperature.

The first and second amplifiers in the first amplifier stage may be cross coupled through an input offset adjustment circuit to minimize unbalancing of the amplifiers. The amplifiers each have first and second input terminals of which the first input terminals are connected to the Hall effect element and the second input terminals are connected to separate ends of a transconductance adjustment resistor. An output bias reference current through the amplifiers is controlled by the bias resistor. A multiple of the current through the transconductance adjustment resistor is transmitted through the current mirror interface to the resistor in the adjustment means in the second amplifier stage.

The first amplifier stage may also be provided with an output offset adjustment to permit further minimization of any offset errors introduced by the amplifier stage. The second amplifier stage may be provided with a null adjustment to permit the device output voltage at zero applied magnetic field to be set anywhere within the normal output voltage swing.

BRIEF DESCRIPITION OF THE DRAWINGS

FIG. 1 is a functional diagram partially in block form of a preferred embodiment of a Hall effect device in accordance with the present invention; and FIG. 2 is a schematic circuit diagram of the Hall effect device of FIG. 1.

DESCRIPTION OF THE PREFERRED EMBODIMENT

Figure 1:
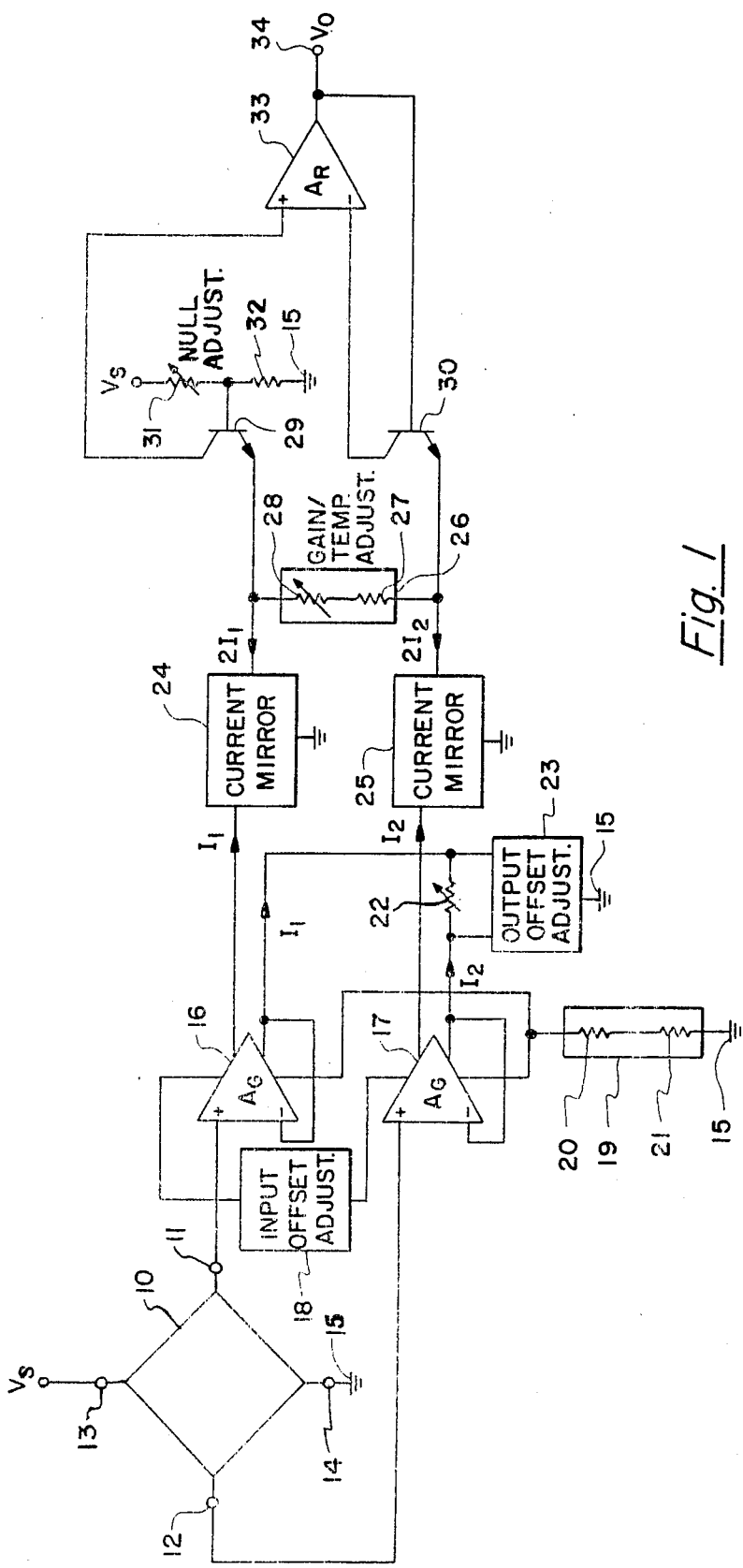

In the diagram of FIG. 1, reference numeral 10 identifies a Hall effect element having output terminals 11 and 12 between which a voltage is produced when a electric current is caused to flow between input terminals 13 and 14 and the element is subjected to a magnetic field. Hall effect element 10 may be formed of N-epitaxial material by conventional processes in an epitaxial layer on a semiconductor substrate along with the circuitry for providing output signal amplification and temperature independent sensitivity compensation. The Hall effect element preferably contains tw identical elements placed in an integrated circuit layout such that the supply current directions ar orthogonal so as to reduce mechanical stress effects. In some situations it may be advantageous to use more than two elements.

As shown in FIG. 1, current is caused to flow between input terminals 13 and 14 of Hall effect element 10 by connecting the terminals to a voltage source $V_s$ and ground 15 respectively. Output terminals 11 and 12 are connected to first and second input terminals respectively of a first amplifier stage comprising a pair of ideally identical amplifiers 16 and 17. Amplifiers 16 and 17 are cross coupled through an input offset adjustment circuit as indicated by block 18. They are also connected to ground 15 through a bias circuit 19 which operates to track the responsivity of Hall effect element 10. For that purpose, bias circuit 19 includes series connected resistors 20 and 21, of which resistor 21 is formed in the same epitaxial layer as Hall effect element 10.

The first stage amplifier is a transconductance amplifier having unity voltage gain and a transfer conductance equal to the difference in the output currents of amplifiers 16 and 17 divided by the difference in voltages between Hall effect device output terminals 11 and 12. Transconductance adjustment of the first stage amplifier is provided by means of a variable resistor 22 shown connected between transconductance adjustment nodes at opposite ends of the resistor. The first amplifier stage is also provided with an output offset adjustment circuit indicated by block 23 connected from the transconductance adjustment nodes to ground 15.

The first amplifier stage produces a pair of currents $I_1$ and $I_2$, the difference of which represents the magnitude of the magnetic field applied to Hall effect element 10. Currents $I_1$ and $I_2$ are supplied to the transconductance adjustment nodes and to current mirrors 24 and 25 which are constructed to produce current doubling and cause currents $2I_1$ and $2I_2$ to flow to a second amplifier stage.

The second amplifier stage is a Norton amplifier having unity voltage gain and a transfer resistance equal to the output voltage differential divided by the input current differential of the stage. The second amplifier stage includes adjustment means identified by reference numeral 26 for adjusting the rate of change of transresistance of the second stage with respect to temperature. As illustrated, adjustment means 26 comprises two resistors 27 and 28 connected in series. Resistor 27 is formed in the same epitaxial layer as Hall effect element 10.

Adjustment means 26 is connected between the emitters of a pair of NPN transistors 29 and 30 which form part of the second amplifier stage. The base of transistor 29 is connected to null adjustment means in the form of a voltage divider comprising a variable resistor 31 and a fixed resistor 32 connected in series between voltage source $V_s$ and ground 15. The collectors of transistors 29 and 30 are connected to noninverting and inverting current input terminals respectively of the differential amplifier 33. The output signal of amplifier 33 forms the output signal $V_o$ on output terminal 34 of the Hall effect device, and is also supplied back to the base of transistor 30.

Figure 2:
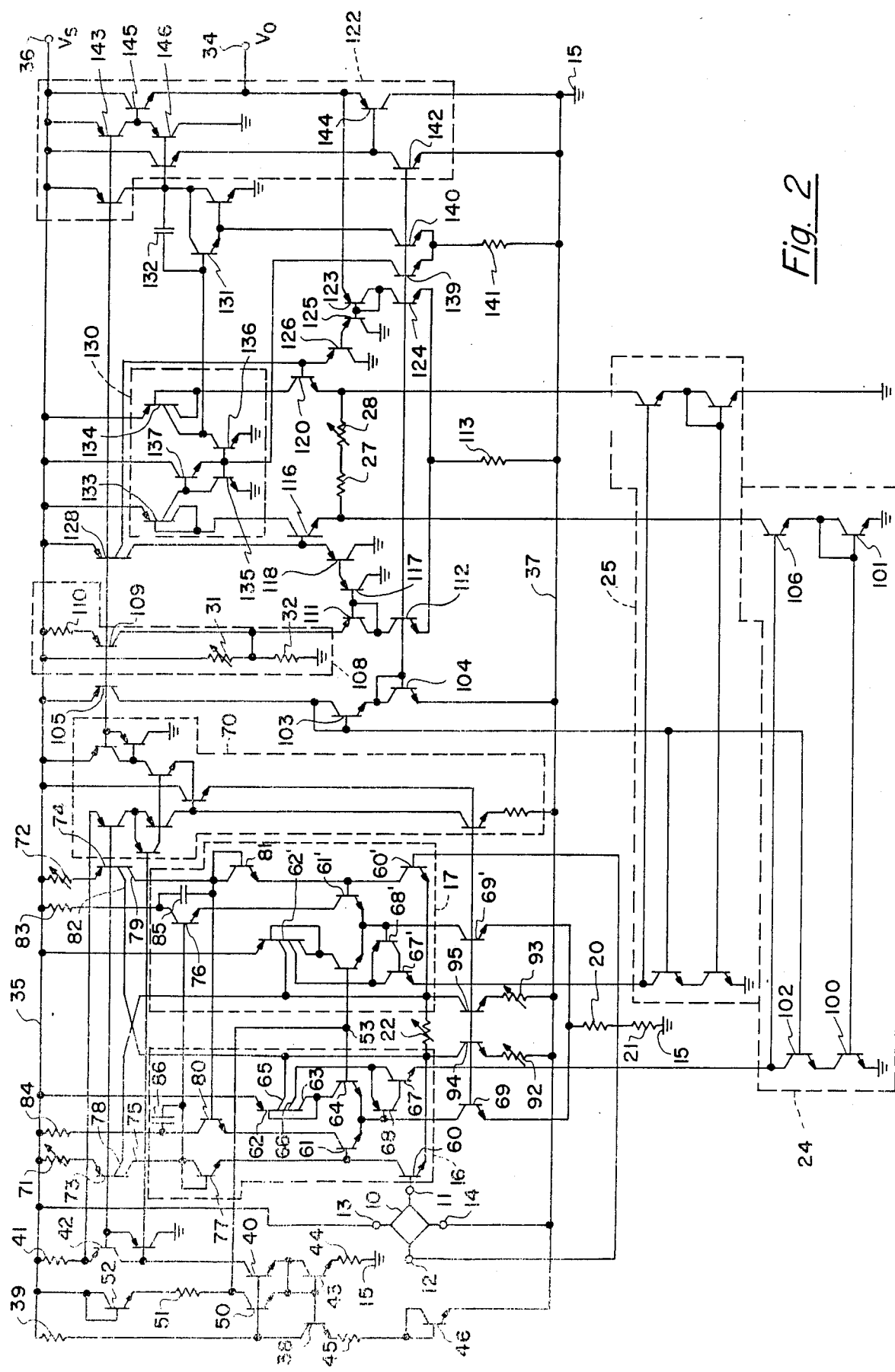

In the circuit diagram of FIG. 2, the Hall effect element and its terminals, the reference voltage source or ground, the two amplifiers forming the first amplifier stage, the resistors comprising the bias circuit, the first stage transconductance adjustment resistor, the two current mirrors, the resistors in the adjustment means in the second stage, the null adjustment resistors, and the device output terminal are identified by the same reference numerals as in FIG. 1. In FIG. 2, reference numeral 35 identifies a voltage supply conductor connected to a source of supply voltage $V_s$ identified by reference numeral 36. Reference numeral 37 identifies a reference voltage conductor connected to a source of reference voltage or ground 15. Hall effect element 10 is connected directly between the voltage supply and reference voltage conductors 35 and 37 to achieve ratiometric characteristics of sensitivity, i.e., the Hall effect element output voltage always varies by the same percentage as the supply voltage.

Also connected between conductors 35 and 37 is a ratiometric current source which, in preferred form, comprises an NPN transistor 38 having its collector connected to supply conductor 35 through a resistor 39. The base drive signal for transistor 38 is supplied through an NPN transistor 40 having its collector connected to supply conductor 35 through a resistor 41 in series with a PNP transistor 42. The base of transistor 40 is connected to the collector of transistor 38, and its emitter is connected to the base of transistor 38 so as to provide base current loading compensation.

The emitter of transistor 40 is also connected to reference voltage conductor 15 through an NPN transistor 43 arranged as a diode, and a resistor 44. The diode formed by transistor 43 matches the characteristics of transistor 38. The emitter of transistor 38 is connected to reference voltage conductor 15 through a resistor 45 and an NPN transistor 46 arranged as a diode.

The base drive signal supplied to transistor 40 is also supplied to an NPN transistor 50 whose collector is connected to supply conductor 35 through a series connected resistor 51 and a transistor 52 arranged as a diode, and whose emitter is connected to the emitter of transistor 40. It can be shown that if the resistance of resistor 39 is twice the resistance of resistor 45, the base emitter voltages of the transistors cancel out, and the voltage at the emitter of transistor 43 is temperature independent and ratiometric with the supply voltage.

Amplifier 16 has first and second input terminals of which the first input terminal is connected to output terminal 11 of Hall effect element 10. Node 53 which is shared with amplifier 17, is connected to the ratiometric current source so as to provide Early effect compensation. The first input terminal of amplifier 17 is connected to output terminal 12 of Hall effect element 10.

Amplifiers 16 and 17 in combination with variable control resistor 22 form a voltage to current converter. This scheme forces the Hall effect element loading currents to be independent of both the gain resistor value and the input signal from the Hal effect element, as is necessary to achieve temperature independent sensitivity.

Resistor 22 is preferably an external thick film laser trimmable resistor. Amplifiers 16 and 17 form a balanced pair, and are cross coupled through an input offset adJustment circuit with cross coupling compensation, described in more detail hereinafter. The amplifiers are connected in a unity voltage gain configuration, and the voltage across resistor 22 is equal to the output voltage of the Hall effect element. The signal produced by the first amplifier stage is the difference between the output currents produced by amplifiers 16 and 17, and is proportional to the voltage across resistor 22.

The preferred construction of amplifiers 16 and 17, of which only amplifier 16 will be specifically described, includes an NPN transistor 60 whose base electrode comprises the first input terminal of the amplifier, and whose emitter electrode is connected to one end of resistor 22. The collector of transistor 60 and the base of an NPN transistor 61 are connected to the input offset adjustment circuit.

Amplifier 16 further includes a multiple collector PNP transistor 62 having its emitter connected to supply conductor 35 and one collector 63 connected to its base. Collector 63 is also connected to the collector of an NPN transistor 64 whose base is connected to node 53.

A second collector 65 of transistor 62 is connected to the emitter of transistor 60 and provides a feedback current. A third collector 66 of transistor 62 produces a current which comprises one input signal to the second amplifier stage. This output current is supplied through an NPN transistor 67 which is interconnected with a PNP transistor 68 to provide Early effect or base width modulation compensation with respect to temperature changes.

Currents through collectors 65 and 66 of transistor 62 are produced regardless of whether there is a magnetic field applied to Hall effect element 10. When there is no applied magnetic field, the required current is temperature independent. When there is an applied magnetic field, the portion of the current due to the field is temperature dependent. Compensation tracking for the current bias of differential transistor pair 61, 64 is provided by supplying the current bias through series connected bias resistors 20 and 21, of which resistor 21 is formed in the epitaxial layer. By appropriately proportioning the resistances of resistors 20 and 21, the bias current may be made to track the responsivity of Hall effect element 10.

The source of the bias current is an NPN transistor 69. Specifically, the collector of transistor 69 is connected to the emitters of transistors 61 and 64 and the emitter of transistor 69 is connected to ground 15 through resistors 20 and 21. The base drive for transistor 69 is provided by a reference circuit 70 which also provides the base drive for corresponding transistor 69' in amplifier 17, and for current source transistors used in con3unction with output offset trim resistors as is noted hereinafter.

Amplifier 17 is ideally identical to amplifier 16. However, small differences in performance parameters occur because of unavoidable fabrication process variations. In addition, the amplifiers may exhibit small input offset voltages which must be compensated for because the Hall element output signal is small and high accuracy is required. More particularly, if the base-emitter voltages of transistor 60 and corresponding transistor 60' in amplifier circuit 17 are not equal, a temperature error term will result at the input to the first amplifier stage. Since this error is at the input, it is very significant due to the gain multiplication of the circuit. Input offset adjustment is accomplished by trim resistor 71. A second trim resistor 72 may be provided t further facilitate input offset adjustment.

The input offset adjustment circuit is combined with a cross coupling arrangement including dual collector PNP transistors 73 and 74 that allows the current densities of the base-emitter junctions of transistors 60 and 60' to be adjusted without unbalancing the output. Cross coupling is accomplished by forcing the difference of the currents into the nodes at the ends of resistor 22 to remain constant regardless of the base-emitter current densities. As the base-emitter current density in one of transistors 60 and 60' is increased due to trimming, the current into the associated node of resistor 22 increases. However, the circuit concurrently adds the same amount of current to the other node of resistor 22, resulting in a continuously balanced state.

Collector 75 of transistor 73 is connected to the base of an NPN transistor 76 whose emitter is connected to the collector of a transistor 61' in amplifier 17. Collector 75 is also connected to the collector of transistor 60 through an NPN transistor 77 arranged as a diode. Collector 78 of transistor 73 and a collector of multiple collector PNP transistor 62' in amplifier 17 are connected to the node in amplifier 17 at one end of resistor 22.

Similarly, collector 79 of transistor 74 is connected to the base of an NPN transistor 80 whose emitter is connected to the collector of transistor 61 in amplifier 16. Collector 79 is also connected to the collector of transistor 60' through an NPN transistor 81 arranged as a diode. Collector 82 of transistor 74 and collector 65 of multiple collector PNP transistor 62 in amplifier 16 are connected to the node in amplifier 16 at the other end of resistor 22. The collectors of transistors 76 and 80 are connected to voltage supply conductor 35 through resistors 83 and 84 respectively.

The base current of transistor 61 is approximately equal to the base current of transistor 80, and the base current of transitor 61' is approximately equal to the base current of transistor 76. The collector loading of transistor 60 equals the sum of the base currents of transistor 61 and transistor 76. Likewise, the collector loading of transistor 60' is equal to the sum of the base currents of transistor 61' and transistor 80. Thus, the collector loading currents of transistors 60 and 60' are constrained to be equal.

Reference numerals 85 and 86 identify capacitors which, in combination with transistors 76 and 80 and resistors 83 and 84, provide frequency compensation for stable operation. Diodes 81 and 77 bias transistors 76 and 80 and also lower the voltages across capacitors 85 and 86 to achieve higher capacitance per unit area, thereby facilitating circuit integration.

Transistors 67 and 68 compensate for Early effects in transistor 62 by providing the same bias voltage temperature characteristics for collectors 65 and 66. Likewise, transistors 67' and 68' in amplifier 17 perform a similar function with respect to transistor 62'.

Temperature compensation of the overall gain of the Hall effect device will be discussed in greater detail hereinafter. It is, however, pointed out that in order to achieve such compensation without a null shift, the voltage across resistors 27 and 28 must be zero with no applied magnetic field. This adjustment is made with output offset trim resistors 92 and 93. Resistor 92 in series with a current source transistor 94 is connected between the node in amplifier 16 a one end of resistor 22 and ground 15. Similarly, resistor 93 in series with a current source transistor 95 is connected between the node in amplifier 17 at the other end of resistor 22 and ground 15. The base drive signals for transistors 94 and 95 are provided by reference circuit 70. Resistors 92 and 93 can be trimmed to adjust the voltage across resistors 27 and 28 to zero for null condition temperature compensation.

The output signal currents of amplifiers 16 and 17 are suitably multiplied, preferably by a factor of two, and supplied to the second amplifier stage by means of current mirrors 24 and 25. In current mirror 24, NPN transistors 100 and 101 form a conventional current mirror. NPN transistor 102 operates to compensate for the effects of base loading currents. The emitter of transistor 102 is maintained at one emitter-base voltage drop above ground by transistors 103 and 104 arranged as series connected diodes which are supplied with a positive voltage bias through PNP transistor 105. Transistor 106 functions to compensate for Early effects. Current mirror 25 is identical to current mirror 24.

In the second amplifier stage, the input current difference is forced to flow through resistors 27 and 28, thereby creating an output voltage referenced to an externally adjustable voltage at a null circuit divider node. The null circuit is identified in FIG. 2 by reference numeral 108. Circuit 108 includes a voltage divider comprising adjustable resistor 31 and resistor 32 connected in series between voltage supply conductor 34 and ground 15. PNP transistor 109 in combination with resistor 110 forms a current source which biases NPN transistor 111. Transistor 111 is controlled by current source transistor 112 whose collector is connected to the base and collector of transistor 111, and whose emitter is connected to ground 15 through a resistor 113. The loading effect of the voltage divider can, thus, be made very small, the effect of which is to minimize any temperature drift of the null voltage.

The voltage signal produced by transistor 111 is supplied to the base of an NPN transistor 116 through PNP transistors 117 and 118. Transistor 117, together with transistors 111 and 112 are necessary primarily to match corresponding transistors which provide output fault protection as is described hereinafter.

The emitter of transistor 116 and the emitter of a corresponding transistor 120 are connected to opposite ends of the series combination of resistors 27 and 28. Transistor 120 receives a feedback signal from a push-pull output circuit 122 through an arrangement of transistors 123-126 corresponding to transistor arrangement 111, 112, 117 and 118. Transistors 123-125 are necessary primarily to provide output fault protection. The voltage feedback to the base of transistor 120 forces the emitter currents of transistors 116 and 120 to be equal. Thus, when the output currents of current mirrors 24 and 25 are equal there is no voltage drop across resistors 27 and 28, and the output voltage $V_o$ on output terminal 34 is equal to the voltage at the null circuit divider node.

The bases of transistors 116 and 120 are connected to the collectors of a dual collector PNP transistor 128 whose emitter is connected to voltage supply conductor 35. The collectors of transistors 116 and 120 are connected to voltage supply conductor 35 through a transconductance reduction circuit 130.

The need for circuit 130 arises because, if the input currents to resistors 27 and 28 are too low, the resistors would be required to have a large resistance, and would consume too much chip area. However, the current at the base of NPN transistor 131 must be small so that compensation capacitor 132 can be made small for minimizing chip area, while remaining adequate to produce a stable phase margin. Thus, current reduction may be achieved by using current mirrors comprising dual collector PNP transistors 133 and 134 which preferably produce a reduction of about 20 to 1. The active load is then formed by a current mirror comprising NPN transistors 135 and 136. Transistor 137 compensates for the effects of base loading currents, and achieves the same collector bias for transistor 133 as transistor 131 does for transistor 134 in order to compensate for Early effects in transistors 133 and 134.

NPN transistors 139 and 140 whose emitters are connected to reference voltage conductor 37 through a resistor 141 form current sources connected to the emitters of transistors 131 and 137, and help equalize the base-emitter voltages of the transistors for better Early effect compensation. The current reduction scheme also allows a larger voltage swing at the base of transistor 120 than if a PNP active load were used. This is required so that transistor 120 does not saturate when the output voltage is at the high end of its range.

The design of push-pull output circuit 122 of the second amplifier stage eliminates crossover distortion. By scaling the base-emitter areas of the transistors in the circuit and providing the proper values of currents produced by NPN transistors 142 and 143, the null load idling current and maximum load currents can be set to desired values.

The output circuit together with the previoiusly noted fault protection circuitry provides for fault protection in that if a discontinuity occurs in conductors leading from external sources of reference and supply voltages to conductor 37 and terminal 36 respectively, or in the conductor leading to output terminal 34, the voltage at the output terminal goes to either approximately the supply voltage or ground. The above described circuitry is required because of the need to block substrate diode currents from reaching output terminal 34.

Specifically, if the external conductor leading to supply terminal 36 breaks, no voltage is supplied to the circuit so that the output voltage at terminal 34 goes to zero volts because the terminal is connected to ground through a external load resistor. Also, if the conductor between output circuit 122 and output termimal 34 breaks, the load resistor will pull output terminal 34 to zero volts.

In the event of a discontinuity in the conductor connecting reference voltage conductor 37 to ground, the substrate diode currents are blocked to provide fault protection. Since the substrate is connected to ground 15 and Hall element 10 is connected between voltage supply terminal 36 and ground, a current path exists between the voltage supply terminal and the substrate. Since transistor 144 in output circuit 122 is a PNP transistor, its base substrate diode current is blocked by its reverse biased base-emitter junction. The base current of transistor 145 is blocked by PNP transistors 143 and 146 which provide its base drive. Also, since the feedback interface is provided by PNP transistor 123, no substrate current will be conducted to output terminal 34. Thus, the output voltage will be at zero volts in the event of a discontinuity in the external connection to reference voltage conductor 37.

Transistors 123, 124 and 125 and their counterparts 111, 112 and 117 serve to make this fault protection possible. Otherwise, if output terminal 34 were connected directly to the base of transistor 126, its base substrate diode would conduct current to the output terminal in the event of a discontinuity in the external connection to reference voltage conductor 37.

In accordance with the foregoing discussion, it can be seen that the applicant has provided a unique Hall effect integrated circuit which produces a linear and highly accurate output signal over an extended temperature range, and which is well adapted to volume production at a very low cost. Although a specific embodiment of the applicant's Hall effect device has been shown and described for illustrative purposes, a number of variations and modifications will be apparent to those of ordinary skill in the relevant arts. It is not intended that coverage be limited to the specific embodiment shown, but only by the terms of the following claims.

The embodiments of the invention in which an exclusive property or right is claimed are defined as follows:

1. A temperature compensated integrated circuit Hall effect device comprising:
   a substrate having an epitaxial layer thereon;
   a Hall effect element formed in said epitaxial layer, said Hall effect element having first and second output terminals between which is produced a voltage difference indicative of the magnitude of an applied magnetic field; and
   amplifier means connected to the first and second output terminals of said Hall effect element for receiving a voltage difference produced in response to a magnetic field and producing an output voltage whose magnitude is substantially linearly related to the magnitude of the magnetic field over an extended temperature range, said amplifier means including resistor means having a first resistive portion formed in the epitaxial layer and a second resistive portion having a constant temperature coefficient.

2. The Hall effect device of claim 1 wherein said resistor means includes a first gain control resistor comprising the first and second resistive portions; and
   the resistance of the second resistive portion is a predetermined fraction of the resistance of the first resistive portion.

3. The Hall effect device of claim 2 wherein:
said amplifier means includes a first amplifier stage having first and second ideally identical amplifiers each with an input terminal and an output terminal, the input terminals of said first and second amplifiers being connected to the first and second output terminals respectively of said Hall effect element, said amplifier means further including a second amplifier stage comprising a differential amplifier with first and second input terminals and an output terminal, and interstage transfer means connecting the output terminals of the first amplifier stage to the input terminals of the second amplifier stage; and
the first gain control resistor determines the transresistance of said second amplifier stage.

4. The Hall effect device of claim 3 wherein said resistor means further includes a bias resistor comprising a third resistive portion formed in the epitaxial layer and a fourth resistive portion with a constant temperature coefficient, the bias resistor being connected in the first amplifier stage so as to cause the bias currents for said first and second ideally identical amplifiers to track the responsivity of said Hall effect element to applied magnetic fields.

5. The Hall effect device of claim 4 wherein said second and fourth resistive portions are thin film chromium silicon resistors connected in series with the first and third resistive portions respectively.

6. The Hall effect device of claim 5 wherein:
said first amplifier stage is configured to operate as a voltage to current converter;
said second amplifier stage is configured to operate as a current to voltage converter; and
said interstage transfer means comprises current mirror means.

7. The Hall effect device of claim 6 further including a second gain control resistor connected between said first and second ideally identical amplifiers, said second gain control resistor being operable to determine the transconductance of said first amplifier stage.

8. The Hall effect device of claim 7 wherein said first amplifier stage includes:
an input transistor in each of said first and second ideally identical amplifiers, the base electrodes of the input transistors forming the input terminals of said first amplifier stage;
input offset adjustment means for permitting the current densities at input transistor base-emitter junctions in said first and second amplifiers to be adjusted without unbalancing the output differential of the first and second amplifiers; and
output offset adjustment means for permitting the current through the first and second resistive portions of the first gain control resistor to be adjusted to zero with zero magnetic field applied to said Hall effect element.

9. The Hall effect device of claim 8 wherein said second amplifier stage includes null adjustment means for setting the output voltage of said second amplifier stage to a desired value with zero magnetic field applied to said Hall effect element.

10. The Hall effect device of claim 9 wherein:
voltage supply and reference voltage conductors are included;
said first and second ideally identical amplifiers include cross-coupled current control means; and
said input offset adjustment means comprises variable resistor means connected between said voltage supply conductor and the current control means in said first and second amplifiers.

11. The Hall effect device of claim 10 wherein said output offset adjustment means comprises variable resistor means connecting said first and second ideally identical amplifiers to said voltage reference conductor for adjusting the difference in output currents produced by said first amplifier stage.

12. The Hall effect device of claim 11 wherein the third and fourth resistive portions of said bias resistor are connected in series, the series connected third and fourth resistive portions connecting said first and second amplifiers to said reference voltage conductor.

13. A temperature compensated integrated circuit Hall effect device having a voltage supply terminal, a reference voltage terminal and an output terminal, the Hall effect device comprising:
a substrate having an epitaxial layer thereon;
a Hall effect element formed in said epitaxial layer, said Hall effect element being operable to produce a voltage difference between first and second terminals thereof when an electric current is caused to flow between third and fourth terminals thereof and said element is subjected to a magnetic field;
a voltage supply conductor connected to the voltage supply terminal;
a reference voltage conductor connected to the reference voltage terminal;
first and second ideally identical amplifiers, each having first and second input terminals, an input offset adjustment terminal, a temperature tracking bias terminal and output terminal means, the first input terminals of the first and second amplifiers being connected to the first and second terminals respectively of said Hall effect element, the input offset adjustment terminals of said first and second amplifiers being connected to said voltage supply conductor through first and second input offset adjustment circuits respectively, the temperature tracking bias terminals of said first and second amplifiers being connected to said reference voltage conductor through bias resistor means including a first resistive portion formed in the epitaxial layer on said substrate, and the output terminal means of said first and second amplifiers being connected to said reference voltage conductor through output offset adjustment means including output offset adjustment resistors;
a first gain control resistor connected between the second input terminals of said first and second amplifiers;
a third amplifier having first and second input terminals, a null adjustment terminal, and an output terminal connected to the output terminal of the Hall effect device, the null adjustment terminal being connected to said voltage supply conductor and said reference voltage conductor through a voltage divider;
a second gain control resistor connected between the first and second input terminals of said third amplifier, said second gain control resistor including a first resistive portion formed in the epitaxial layer on said substrate; and
first and second current mirrors connecting the output terminal means of said first and second amplifiers to the first and second input terminals of said third amplifier respectively.

14. The Hall effect device of claim 13 wherein the bias resistor means includes a second resistive portion having a constant temperature coefficient connected in series with the first resistive portion formed in the epitaxial layer; and the second gain control resistor means includes a second variable resistive portion connected in series with the first resistive portion formed in the epitaxial layer.

15. The Hall effect device of claim 14 wherein the first and second input offset adjustment circuits, the bias and output offset adjustment resistors associated with said first and second amplifiers and said second gain control resistor means include thin film chromium silicon resistors.

16. The Hall effect device of claim 15 wherein said third ampifier includes fault protection means for bringing the voltage at the output terminal of the Hall effect device within a predetermined range of the voltage supplied to the voltage supply terminal or the reference voltage terminal from an external source in the event of an electrical discontinuity in the connection between the voltage supply or reference voltage terminal and the external source of the supply or reference voltage respectively.

* * * * *